(12) United States Patent
Saito (10) Patent No.: US 6,443,669 B2
(45) Date of Patent: Sep. 3, 2002

(54) ELECTRONIC COMPONENT FEEDING APPARATUS

(75) Inventor: Koji Saito, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/742,223

(22) Filed: Dec. 22, 2000

(30) Foreign Application Priority Data

Dec. 24, 1999 (JP) ............................................. 11-367858

(51) Int. Cl.⁷ .............................................. B65G 51/36
(52) U.S. Cl. ...................... 406/28; 221/278; 198/390; 198/396; 406/74; 406/133; 406/151; 406/177; 406/180
(58) Field of Search ............................. 406/28, 73, 74, 406/133, 151, 177, 180, 396; 198/390; 221/278

(56) References Cited

U.S. PATENT DOCUMENTS

| 4,275,976 | A | * | 6/1981 | Sticht | ......................... 406/28 |
| 5,525,023 | A |   | 6/1996 | Soga et al. | |
| 5,636,725 | A | * | 6/1997 | Saito et al. | ................. 198/396 |
| 6,073,800 | A | * | 6/2000 | Saito et al. | ................. 221/212 |
| 6,135,264 | A | * | 10/2000 | Saito et al. | ................. 198/396 |
| 6,210,081 | B1 | * | 4/2001 | Saho et al. | ................. 406/134 |
| 6,283,325 | B1 | * | 4/2001 | Saito et al. | ................. 221/200 |
| 6,336,569 | B1 | * | 1/2002 | Kondo et al. | ............... 221/200 |

FOREIGN PATENT DOCUMENTS

| JP | 6-232596 | | 8/1994 | |
| JP | 11-180177 | * | 6/1999 | ........... B65G/47/14 |

* cited by examiner

Primary Examiner—Christopher P. Ellis
Assistant Examiner—Joe Dillon, Jr.
(74) Attorney, Agent, or Firm—Lowe Haupman Gilman & Berner, LLP (57) ABSTRACT

An electronic component feeding apparatus for conveying aligned electronic components includes a conveying tube, a cylinder for sucking air from an end of the tube, and a movable stopper plate for stopping the conveyed, aligned electronic components.

21 Claims, 6 Drawing Sheets

ELECTRONIC COMPONENT FEEDING APPARATUS

BACKGROUND OF THE INVENTION

1. Field of the Invention

The present invention relates to an electronic component feeding apparatus which conveys electronic components such as chip components in a alignment state to a predetermined position.

2. Description of the Related Art

A conventional electronic component feeding apparatus is disclosed in Japanese Patent Laid-Open No. 6-232596 and U.S. Pat. No. 5,525,023 corresponding to said Japanese Patent Laid-Open. This apparatus discharges chip components stored in a storage chamber in a bulk state through a component convey pipe onto a belt, conveys forward chip components discharged on the belt by use of the belt, and stops the chip components conveyed with the belt by use of a stopper.

A rachet mechanism intermittently drives the belt. The cost of such apparatus is relatively high and cannot be easily reduced because of the complexity of the belt and its drive mechanism.

SUMMARY OF THE INVENTION

An object of the present invention is to provide a simple and inexpensive electronic component feeding apparatus.

To attain the object, an electronic component feeding apparatus according to the present invention includes: a conveying passage for conveying electronic components having a predetermined shape in a alignment state; a sucking device for exerting an air suction into the conveying passage from an end of the conveying passage and conveying the electronic components in the conveying passage; a movable component stopper for stopping the electronic components conveyed in the alignment state by the air suction; and a displacing device for displacing the component stopper from a stop position to a removed position therefrom after the electronic components conveyed are stopped by the component stopper. Furthermore, an electronic component feeding apparatus according to the present invention includes: a conveying passage for conveying electronic components having a predetermined shape in a alignment state; a sucking device for exerting a air suction into the conveying passage from an end of the conveying passage and conveying the electronic components in the conveying passage; and a movable component stopper for stopping the electronic components conveyed in the alignment state by the air suction; wherein the conveying passage is composed of a tube having a bore whose cross section allows the electronic components to pass through the bore in a predetermined direction.

These apparatuses can convey the electronic components in the conveying passage in the alignment state by exerting the air suction into the conveying passage from the end of the conveying passage, and stop the electronic components conveyed in the alignment state by use of the component stopper. That is, it is possible to convey the electronic components in the alignment state to the predetermined position by these apparatuses having the conveying passage, the sucking device, and the component stopper. Since these apparatuses do not need the belt and the belt drive mechanism of the conventional apparatus, the simple and inexpensive electronic component feeding apparatus can be provided.

The above-described and other objects, features and advantages of the present invention will be apparent from the following descriptions made with reference to the accompanying drawings.

DESCRIPTION OF THE PREFERRED EMBODIMENT

Figure 1:
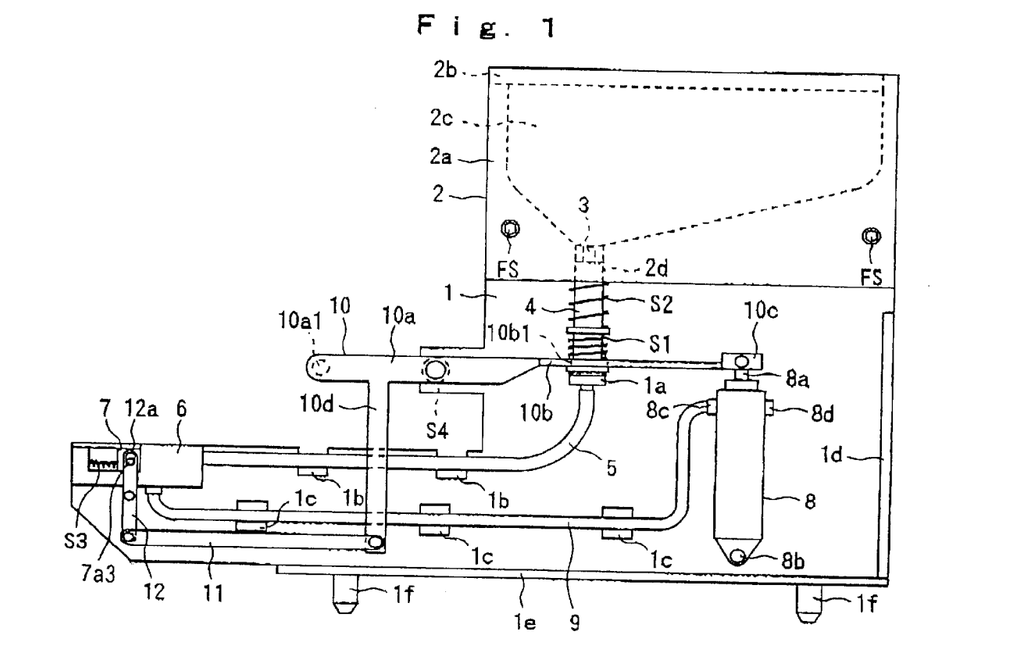
FIG. 1 is a side view of an electronic component feeding apparatus showing one embodiment of the present invention.
Figure 2:
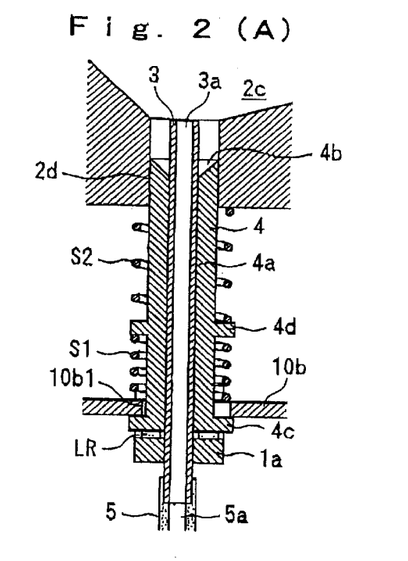
FIG. 2(A) is an enlarged longitudinal section view of a stationary pipe and a movable pipe shown in FIG. 1.
FIG. 2(B) is a top view of the stationary pipe and the movable pipe shown in FIG. 1.
FIG. 2(C) is an end top view of a conveying tube shown in FIG. 1.

FIGS. 1 through 13 show an embodiment of an electronic component feeding apparatus according to the present invention. In FIGS. 1 through 13, reference numeral 1 denotes a frame, 2 denotes a storage container, 3 denotes a stationary pipe, 4 denotes a movable pipe, 5 denotes a conveying tube, 6 denotes a feed block, 7 denotes a slider, 8 denotes an air cylinder, 9 denotes an air tube, 10 denotes a driving lever, 11 denotes a link, and 12 denotes a driven lever. In the following descriptions, the left side of FIG. 1 is referred to as "front," the right side of FIG. 1 is referred to as "back or rear," the near side of FIG. 1 is referred to as "left," and the back side of the FIG. 1 is referred to as "right."

The apparatus in FIGS. 1 through 13 feeds electronic components P of square pole shape having a dimensional relationship such as length>width=height. The electronic component P includes a chip component such as chip capacitor, chip resistor, chip inductor, and so on; a composite component such as LC filter and so on; and an array component such as capacitor array, inductor array, and so on.

The frame 1 is manufactured by punching a plate made of stainless steel or the like into a predetermined shape and forming a plate material on a bending and so on. This frame has a support bracket 1a for the stationary pipe, a plurality of support brackets 1b for the conveying tube 5, and a plurality of support brackets 1c for the air tube 9, which are formed by local cutting and standing, on one side of the frame 1. This frame 1 has bent parts 1d and 1e at the back side (on the right side of the drawing) and bottom side to increase frame's rigidity. The bent part 1e is provided with a plurality of positioning pins 1f to attach the apparatus to other member. If the thickness of the frame 1 is rigid enough to ensure predetermined rigidity, the bent parts 1d and 1e are not always necessary.

The storage container 2 comprises a flat storage container body 2a with an top opening which is formed by a resin molding and a slide lid 2b which freely slides to cover and uncover the top opening of the storage container body 2a. A flat storage chamber 2c with an about V-shaped inclined bottom is formed in the storage container body 2a. A bore 2d circular in cross section, into which the movable pipe 4 is inserted so that it can move up and down, is formed so that the bore 2d runs from the bottom of the storage container body 2a into the deepest part of the inclined bottom. Using an appropriate number of screws FS, the storage container 2 is removably attached to the frame 1.

The stationary pipe 3, made of a metal, a hard resin, etc., has a bore 3a rectangular in cross section and an outer shape circular in cross section. As shown in FIG. 2(B), the cross section of the bore 3a is a square which is slightly larger than, and similar to, that of longitudinal end face shape of an electronic component P. Thus, the electronic component P can longitudinally pass through the bore 3a of the stationary pipe 3. As shown in FIG. 2(A), the stationary pipe 3 is inserted into the center of the bore 2d of the storage container body 2a, its lower end passes through the support bracket 1a of the frame 1 and is fixed to the the support bracket 1a. In FIG. 2(A), the upper end of the stationary pipe 3 is slightly below the upper end of the bore 2d. The upper end of the stationary pipe 3 may be almost at the same level as that of the bore 2d or slightly above the upper end of the bore 2d.

The movable pipe 4, made of a metal, a hard resin, etc., has a bore 4a circular in cross section which is slightly larger than the outer shape of the stationary pipe 3 and an outer shape outer shape circular in cross section which is slightly smaller than that of the bore 2d of the storage container body 2a. A funnel-shaped guide surface 4b is formed at the upper end of the movable pipe 4, and collars 4c and 4d are formed at the lower end of the pipe 4 and above the side. As shown in FIG. 2(A), the movable pipe 4 is disposed outside the stationary pipe 3, with its upper end inserted into the bore 2d of the storage container body 2a. A first coil spring S1 is installed below the upper collar 4d to prevent overload, and a second coil spring S2 is installed above the upper collar 4d to press down the movable pipe 4. The first coil spring S1 produces a larger force than the second coil spring S2. If the force produced by the first coil spring S1 is equal to or smaller than the force produced by the second coil spring S2, however, the movable pipe can move. The bottom of the movable pipe 4 at its lower position (standby position) is in contact with a rubber damper ring LR, installed on the support bracket 1a of the frame 1. The upper end of the movable pipe 4 is below the upper end of the stationary pipe 3. That is, when the movable pipe 4 is at the lower position, a circular recess (not indicated by any reference numeral) which is defined by the guide surface 4b of the movable pipe 4, the outer surface of the stationary pipe 3, and the bore 2d is formed above the movable pipe 4.

The conveying tube 5 is made of a resin such as polypropylene, polyamide system resin, or fluoroplastic, or a metal such as stainless steel. As shown in FIG. 2(C), the cross section of a bore 5a of the conveying tube 5 is a square and almost the same as the bore 3a of the stationary pipe 3. Thus, the electronic component P can longitudinally pass through the bore 5a of the conveying tube 5. An outer shape of the conveying tube 5 is a square similar to the cross section of the bore 5a or circular cross section. A connection recess 5b circular in cross section is formed at a start of the conveying tube 5, the stationary pipe 3 is inserted to and connected with the connection recess 5b As shown in FIG. 2(A), the conveying tube 5 is connected its start with the lower end of the stationary pipe 3 so as to align the internal surface of the bore 5a with the internal surface of the bore 3a of the stationary pipe 3 by using an adhesive according to need. The inlet of the bore 5a of the conveying tube 5 is chamfered or rounded as necessary so that the electronic component P is not caught at the interface between the bore 3a of the stationary pipe 3 to the bore 5a of the conveying tube 5 when the component conveys from the bore 3a to the bore 5a. In the apparatus in the figure, the bore 5a of the conveying tube 5 composes a conveying passage for conveying the electronic component P in a alignment state.

As shown in FIGS. 3, 4, 5(A), and 5(B), the feed block 6 has a passage 6a which has almost the same square cross section as the bore 5a of the conveying tube 5. A connection recess 6b square in cross section is formed at the rear end of the passage 6a, an end of the conveying tube 5 is inserted to and connected with the connection recess 6b. The conveying tube 5 is connected at its end with the feed block 6 so as to align the internal surface of the bore 5a with the internal surface of the passage 6a of the feed block 6 by using an adhesive according to need. The inlet of the passage 6a is chamfered or rounded as necessary so that the electronic component P is not caught at the interface between the bore 5a of the conveying tube 5 to the passage 6a when the component conveys from the bore 5a to the passage 6a. A first recess 6c which is nearly as wide as a shutter plate 7d described later, and has a depth which is almost equal to a distance between the top surface of the feed block 6 and the top surface of the passage 6a is formed above the passage 6a of the feed block 6. A front part of the passage 6a opens through the first recess 6c to the outside. A suction bore 6d circular in cross section which runs from the bottom of the feed block 6 into that of the passage 6a is formed at the bottom of the passage 6a of the feed block 6. The suction bore 6d is fitted at its lower end with an air tube connector CM. A second recess 6e for movably disposing a slider body 7a described later is formed at front side is formed in front of the passage 6a of the feed block 6. The second recess 6e is open at the top and on the right and left sides. A cover plate 6f is disposed on the second recess 6e of the feed block 6 to cover the top opening of the second recess 6e. The bottom of the cover plate 6f is opposite the shutter plate 7d with a small clearance between these two plates.

As shown in FIGS. 3, 4, 5(A), and 5(B), the slider 7 comprises the rectangular slider body 7a, a permanent magnet 7b, a stopper plate 7c, and the shutter plate 7d.

The slider body 7a has at the center of its top a straight groove 7a1 which extends longitudinally. A width of the straight groove 7a1 is slightly smaller than a width of the passage 6a of the feed block 6. A magnet installation hole 7a2 which is circular in cross section and has a predetermined depth is formed at the straight groove 7a1 of the slider body 7a. A cylindrical permanent magnet 7b such as a samarium-cobalt magnet or a ferrite magnet, which has a length almost equal to the depth of the magnet installation hole 7a2, is inserted into the magnet installation hole 7a2 so that the N or S pole of the magnet faces up by using an adhesive according to need. A pin 7a3 which is inserted into an oval hole 12a at the upper end of the driven lever 12 described later is disposed on the left side of the slider body 7a so that the tip of the pin 7a3 protrudes outside from the left side of the feed block 6.

The stopper plate 7c is made of a magnetic material such as iron or the like. This stopper plate 7c is nearly as wide as the straight groove 7a1 of the slider body 7a and has a thickness less than a depth of the straight groove 7a1.

The shutter plate 7d has a width which is slightly smaller than a width of the first recess 6c of the feed block 6. A straight bump 7d1 which is nearly as wide as the straight groove 7a1 in the slider body 7a and has a height smaller than the depth of the straight groove 7a1 is formed at the center of the bottom of the shutter plate.

The slider 7 is assembled by inserting the stopper plate 7c into the straight groove 7a1 of the slider body 7a, and then, disposing the the shutter plate 7d on the slider body 7a so as to fit the straight bump 7d1 into the straight groove 7a1. These parts may be combined together using an adhesive, screws, etc. It is possible to clip the stopper plate 7c by the shutter plate 7d combined with the slider body 7a. After assembling, the bottom of the stopper plate 7c is in contact with the top of the permanent magnet 7b, so that the rear end of the stopper plate 7c has the N or S pole. The rear end of the stopper plate 7c is beyond the shutter plate 7d.

Figure 3:
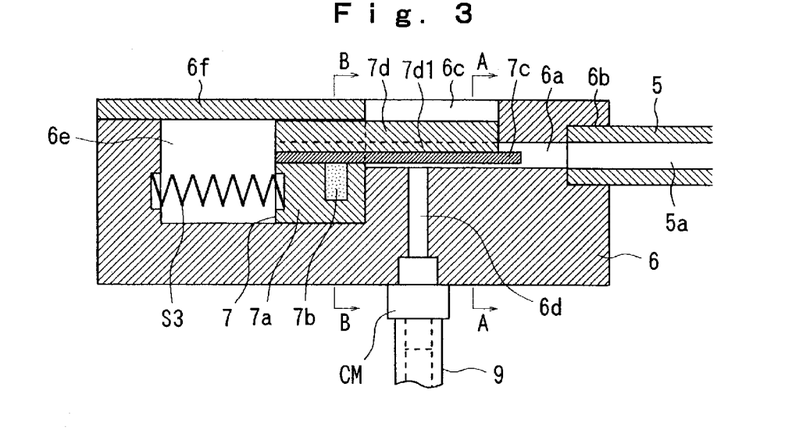
FIG. 3 is an enlarged longitudinal section view of a feed block and a slider shown in FIG. 1.
Figure 4:
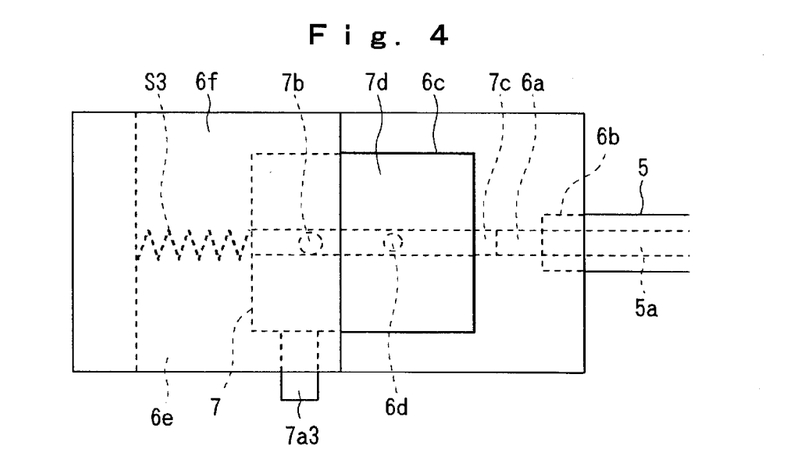
FIG. 4 is an enlarged top view of the feed block and the slider shown in FIG. 1.
Figure 5:
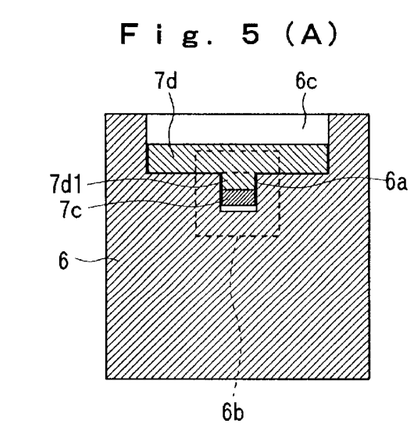
FIG. 5(A) is a sectional view taken along a line A—A in FIG. 3.
FIG. 5(B) is a sectional view taken along a line B—B in FIG. 3.

As shown in FIGS. 3, 4, 5(A), and 5(B), the slider 7 is disposed so that the slider body 7a is in the second recess 6e of the feed block 6 and that the rear of the stopper plate 7c and the rear of the straight bump 7d1 on the shutter plate 7d are in the passage 6a of the feed block 6. A third coil spring S3 which is interposed between the front surface of the slider body 7a and that of the second recess 6e of the feed block 6 urges the slider 7, thus pressing the back surface of the slider body 7a against the back surface of the second recess 6e and the rear end of the shutter plate 7d against the back surface of the first recess 6c. Thus the shutter plate 7d closes the opening of the passage 6a of the feed block 6. As shown in FIGS. 3 and 5(A), a clearance which is a part of a suction passage is between the bottom of the passage 6a and that of the stopper plate 7c. The suction bore 6d and the bore 5a of the conveying tube 5 communicate through the clearance with each other. In the apparatus in the figure, the stopper plate 7c constitutes a component stopper, and the slider 7 constitutes a displacing device which displaces the stopper plate 7c from a stop position to a removed position therefrom.

Figure 6:
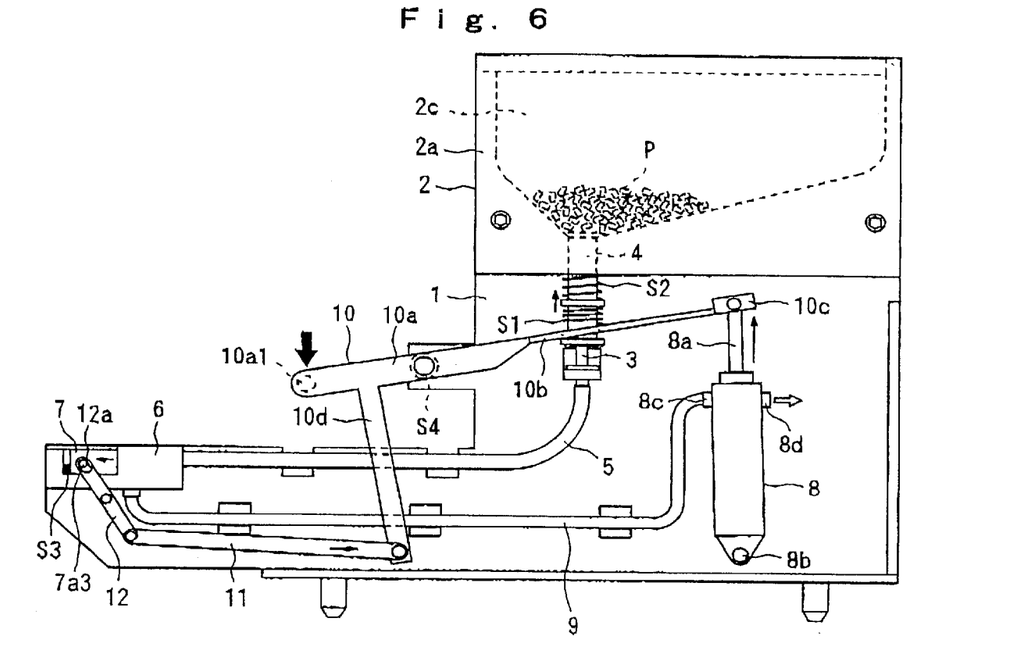
FIG. 6 is a view showing a state in which a drive lever of the apparatus shown in FIG. 1 is pushed down.
Figure 7:
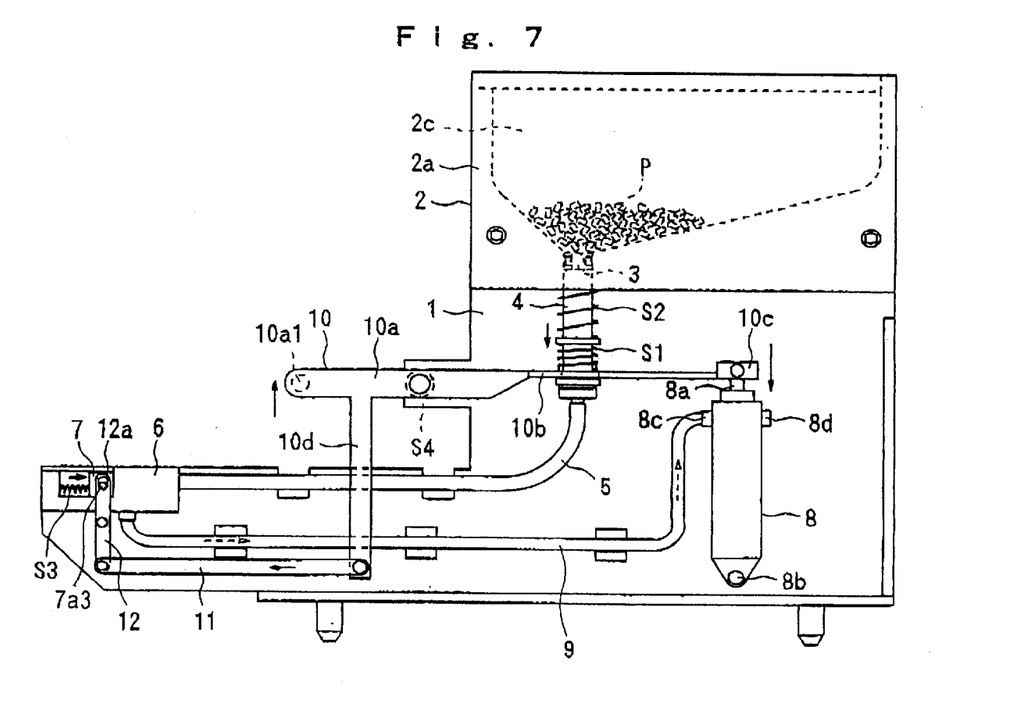
FIG. 7 is a view showing a state in which the drive lever of the apparatus shown in FIG. 1 is released from the pushing down and is returned to its original position.
Figure 8:
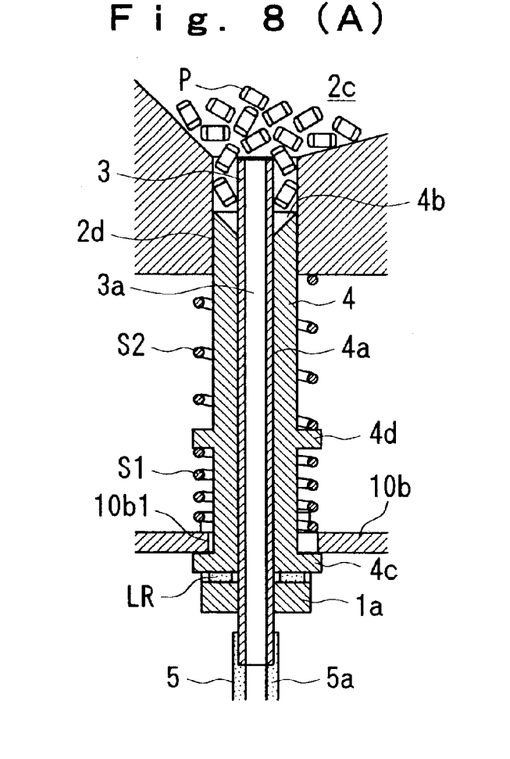
FIGS. 8(A) and 8(B) are views showing an operation in which electronic components in a storage chamber are taken into the stationary pipe by moving up and down the movable pipe.

The air cylinder 8, which has a rod 8a connected with a piston (not shown), is rotatably supported at its lower end 8b on the frame 1. The air cylinder 8 has a suction port 8c and an exhaust port 8d which each incorporate a nonreturn valve (not shown). The suction port 8c is connected through the air tube 9 with the connector CM at the bottom of the feed block 6. As shown in FIG. 7, the air cylinder 8 can suck the air through the suction port 8c by lowering the rod 8a from its upper position, and exert an air suction for conveying the electronic components into the bore 5a of the conveying tube 5 through the suction passage composed by the air tube 9, the suction bore 6d, and the passage 6a. As shown in FIG. 6, the air cylinder 8 can exhaust the air through the exhaust port 8d by lifting the rod 8a from its lower position, and discharge the air in the air cylinder 8 through the exhaust port 8d. Besides, the nonreturn valve in the exhaust port 8d closes when the air is sucked, and the nonreturn valve in the suction port 8c closes when the air is discharged. Thus the air suction can be exerted on the electronic component in the bore 5a of the conveying tube 5 when the air is sucked, and the positive pressure can be prevented from working in the bore 5a of the conveying tube 5 when the air is discharged. In the apparatus in the drawing, the air cylinder 8 constitutes a sucking device which conveys the electronic components P in the bore 5a of the conveying tube 5 using the air suction.

The driving lever 10 is shaped by a first vertical plate 10a, a horizontal plate 10b, and a second vertical plate 10c which are arranged in that order. The first vertical plate 10a has a protrusion 10d extending downward. The driving lever 10 is rotatably supported nearly at the center of the first vertical plate 10a on the frame 1 and urged clockwise in the figure by a torsion coil spring S4. A pressed rod 10a1 is provided on the right side at the front end of the first vertical plate 10a. The pressed rod 10a1 is pressed down by a driving device, not shown, thus causing the driving lever 10 to rotate counterclockwise (see FIG. 6). The horizontal plate 10b is provided with a engaging portion 10b1, that is, a round bore or a U-shaped notch. As shown in FIG. 2(A), the engaging portion 10b1 is between the lower collar 4c of the movable pipe 4 and the first coil spring S1. The rod 8a of the air cylinder 8 is rotatably supported on the second vertical plate 10c.

The rear end of the link 11 is rotatably connected with the lower end of the protrusion 10d. The front end of the link 11 is rotatably connected with the lower end of the driven lever 12. The driven lever 12 is rotatably supported nearly at its center on the frame 1. The pin 7a3 of the slider body 7a is inserted into the oval hole 12a at the upper end of the driven lever 12.

Operation of the apparatus will be described below.

When the apparatus is used to feed thousands to tens of thousands of the electronic components P, which are stored in a bulk state in the storage chamber 2c of the storage container 2, the cycle consisting of the following operations is repeated: (1) using the driving device, not shown, the pressed rod 10a1 of the driving lever 10 in its standby position is pressed down against urging force produced by the torsion coil spring S4 and the second coil spring S2 (see FIG. 6), and then (2) the pressed rod 10a1 is released to return the driving lever 10 to its standby position, using urging force produced by the torsion coil spring S4 and the second coil spring S2 (see FIG. 7).

When the driver lever 10 is rotated counterclockwise through a predetermined angle from the standby position, the horizontal plate 10b causes the movable pipe 4 to rise from the lower position in FIG. 8(A) to the upper position in FIG. 8(b). When mainly the second coil spring S2 contracts, the movable pipe 4 rises, so that its top slightly enters the storage chamber 2c. This is because the force produced by the first coil spring S1 is larger than the force produced by the second coil spring S2. As shown in FIG. 8(A), when the movable pipe 4 is in the lower position, several electronic components P are in the circular recess above the movable pipe 4. Thus when the movable pipe 4 rises, these electronic components P are lifted, thus stirring stored electronic components P. As a result, stored electronic components P are taken one by one into the upper end of the bore 3a of the the stationary pipe 3 in a longitudinal direction, directly or under favor of an inclination of the guide surface 4b. When the driving lever 10 returns to the standby position after it rotates, by returning the horizontal plate 10b, the movable pipe 4 is returned by the urging force produced by the second coil spring S2 from the upper position in FIG. 8(B) to the lower position in FIG. 8(A). At this time, stored electronic components P are also taken one by one into the upper end of the bore 3a of the the stationary pipe 3 as well as the above-mentioned.

The electronic components P taken into the bore 3a of the stationary pipe 3 move down through the bore 3a under the gravity, and are taken into the bore 5a of the conveying tube 5 which is connected to the lower end of the stationary pipe 3. Then the electronic components P taken into the bore 5a of the conveying tube 5 move down through the bore 5a under the gravity, and are changed its posture from a longitudinal position to a lateral position in a curved segment of the conveying tube 5.

Figure 9:
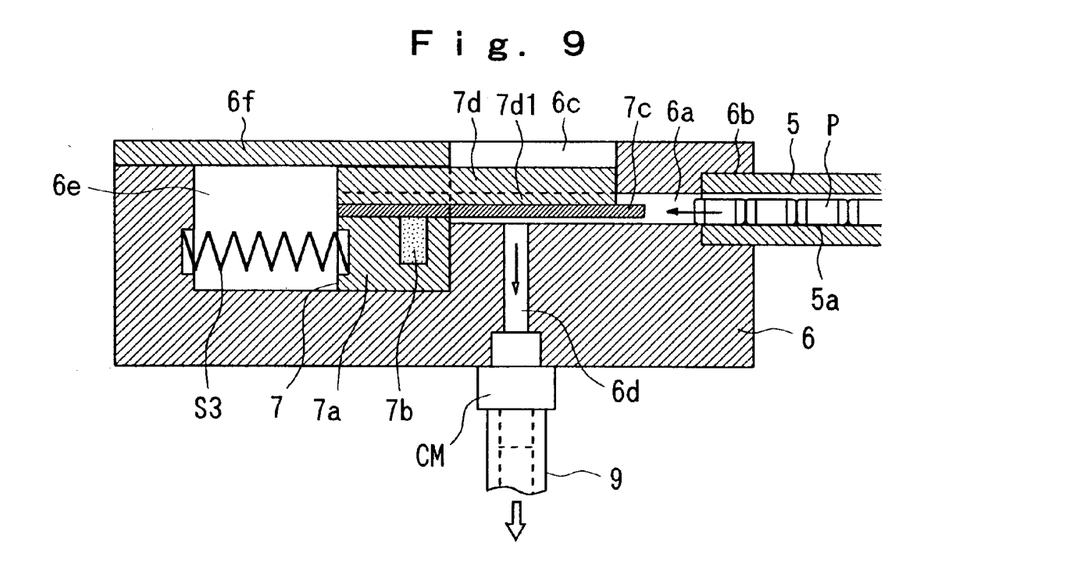
FIGS. 9 and 10 are views showing an operation of conveying electronic components by sucking air.
Figure 10:
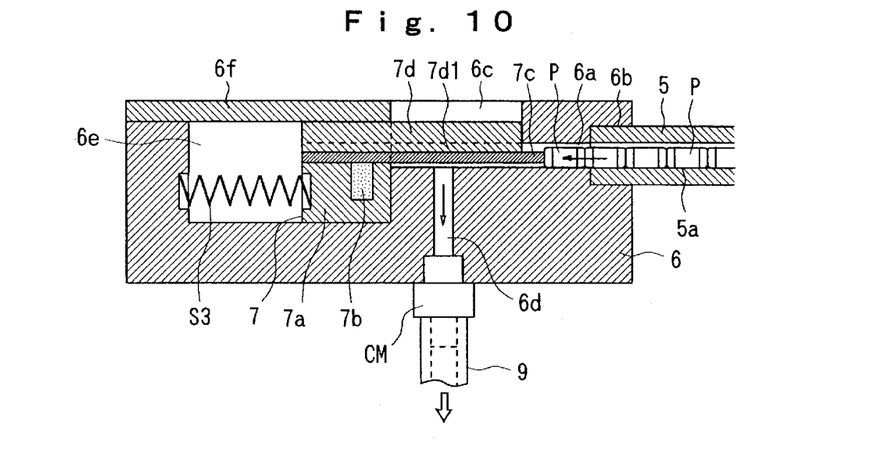

When the driving lever 10 returns to the standby position after it rotates, the rod 8a of the air cylinder 8 lowers from the upper position to the lower position as shown in FIG. 7. Here through the suction passage composed by the air tube 9, the suction bore 6d, and the passage 6a, the air suction for conveying the electronic components is exerted into the bore 5a of the conveying tube 5. The electronic components P in the bore 5a of the conveying tube 5 are moved forward in the alignment state by the air suction as shown in FIG. 9. The electronic components P conveyed in the alignment state by the air suction, stop when the forefront electronic component P against the rear end of the stopper plate 7c as shown in FIG. 10. Following the forefront electronic component P, the subsequent electronic components P are in close contact with each other. The forefront electronic component P is attracted to the rear end of the stopper plate 7c under the action of magnetism, because the rear end of the stopper plate 7c provides the N or S pole as described above.

Figure 11:
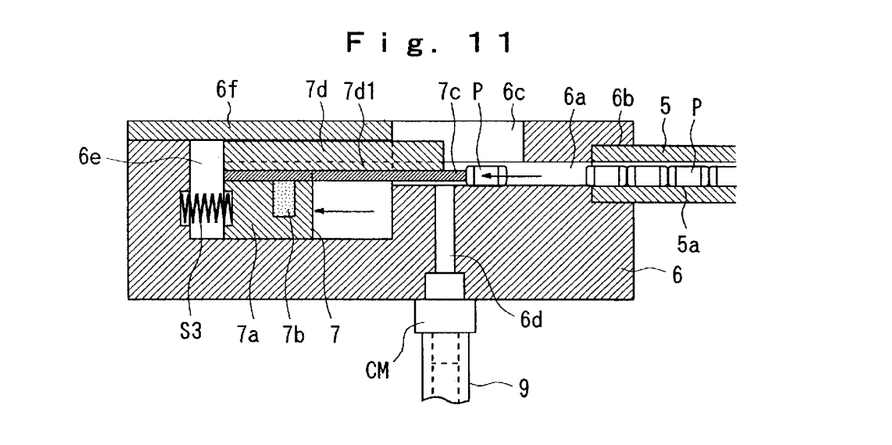
FIG. 11 is a view showing an operation of separating a forefront electronic component from subsequent electronic components by moving the slider forward.
Figure 12:
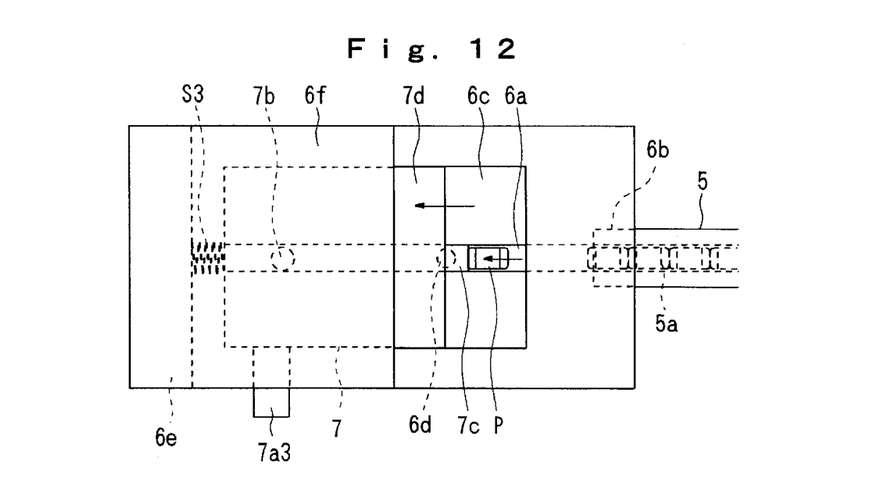
FIG. 12 is a top face view of FIG. 11.
Figure 13:
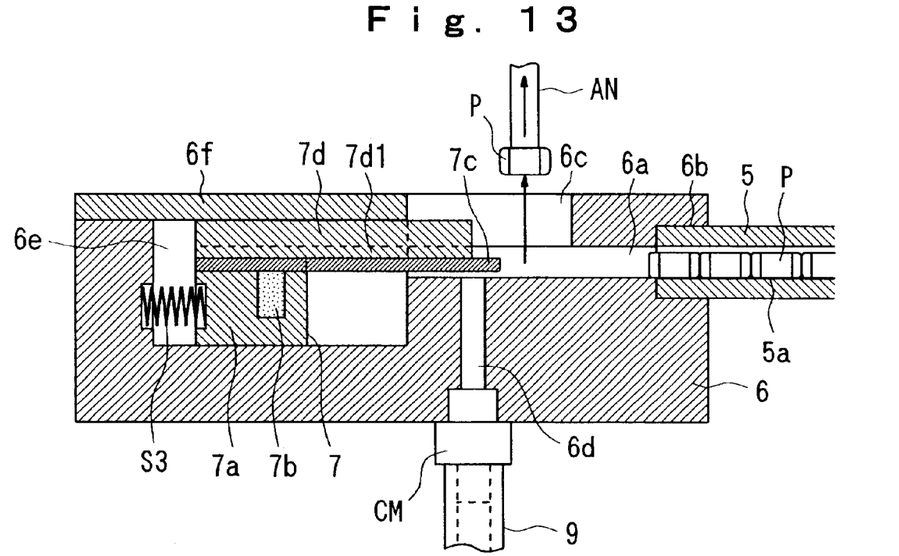
FIG. 13 is a view showing an operation of piking up the forefront electronic component by using a suction nozzle.

On the other hand, when the driving lever 10 is rotated counterclockwise through a predetermined angle from the standby position, as shown in FIG. 6, the protrusion 10d on the driving lever 10 displaces, thus pulling back the link 11, so that the driven lever 12 rotates counterclockwise through a predetermined angle with a pivot at the center. As shown in FIG. 11, when rotating, the driven lever 12 causes the slider 7 to move forward a predetermined distance against the urging force produced by the third coil spring S3. The stopper plate 7c displaces forward from the stop position to the removed position therefrom. The forefront electronic component P, attracted to the rear end of the stopper plate 7c, displaces forward together with the stopper plate 7c, so that the forefront electronic component P is separated from the following electronic components P. The slider 7 moves forward, thus causing the shutter plate 7d to move away from the back surface of the first recess 6c. As a result, the front part of the passage 6a opens to the outside through the first recess 6c, so that the forefront electronic component P is exposed. As shown in FIG. 13, the forefront electronic component P, attracted to the rear end of the stopper plate 7c, is piked up by a suction nozzle AN, which lowers from above the top electronic component.

When the driving lever 10 is returned to the standby position after it is rotated, the protrusion 10d of the driving lever 10 returns to its original position. This causes the link 11 and driven lever 12 to also return to their original positions as shown in FIG. 7, so that the slider 7 returns to its original position under the action of the urging force produced by the third coil spring S3, as shown in FIG. 9. When the slider 7 moves back and forth, the passage 6a, the stopper plate 7c, which is in the passage, and the straight bump 7d1 on the shutter plate 7d; and the first recess 6c and the shutter plate 7d which is in the recess; serve as guides.

According to the aforesaid apparatus, by driving the air cylinder 8 and exerting the air suction into the bore 5a from the end of the conveying tube 5, the electronic components P in the bore 5a can be conveyed in the predetermined position in the alignment state, and can be stopped by the stopper plate 7c. That is, by using the apparatus with the conveying tube 5, the air cylinder 8, and the stopper plate 7c, the electronic components P can be conveyed in the alignment state to the predetermined position. Since this apparatus does not need the belt and the belt drive mechanism of the conventional apparatus, the simple and inexpensive electronic component feeding apparatus can be provided. Moreover, since the conveying passage is composed of the tube 5, a plurality of members do not need to be combined to form the conveying passage. This also helps provide the inexpensive electronic component feeding apparatus.

Further, according to the aforesaid apparatus, by displacing the stopper plate 7c from the stop position to the removed position therefrom with use of the slider 7 after conveyed electronic components P are stopped by the stopper plate 7c, the pick up operation of the forefront electronic component P by use of the suction nozzle AN is easily performed. Since the permanent magnet 7b is brought into contact with the stopper plate 7c so that the rear end of the stopper plate 7c provides the N or S pole, when the electronic components P conveyed by the air suction are stopped by the stopper plate 7c, the forefront electronic component P can be attracted to the stopper plate 7c to keep the position of the forefront electronic component P. In addition, since the forefront electronic component P attracted to the rear end of the stopper plate 7c can be displaced forward together with the stopper plate 7c and separated from the following electronic components P by displacing the stopper plate 7c from the stop position to the removed position therefrom, when the forefront electronic component P is picked up by use of the suction nozzle AN, the forefront electronic component P can be picked up in a stable position as preventing the forefront electronic component P from interfering with the following electronic components P.

Furthermore, according to the aforesaid apparatus, since the air cylinder 8 and the driving lever 10 for activating the air cylinder 8 are installed on the frame 1, there is no need for placing a vacuum pump and plumbing in this vacuum pump, and for preparing a power supply for the vacuum pump and a circuit for controlling air suction. Thus the cost of the apparatus can be reduced. Both because the air cylinder 8 can be operated, by using the driving lever 10 and because the slider 7 can be operated through the link 11 and driven lever 12 which are connected with the driving lever 10, a sequence of component feed operations can be securely performed by only applying a force to the driving lever 10.

Further, according to the aforesaid apparatus, since a take-in device, which is intended to take electronic components in the storage camber 2c into the bore 5a of the conveying tube 5 one by one in the predetermined position, is composed of the stationary pipe 3 and the movable pipe 4, electronic components P can be sequentially introduced into the bore 5a of the conveying tube 5. Moreover, because the movable pipe 4 serves to stir electronic components in the storage chamber 2c and lead them into the bore 3a of the stationary pipe 3 and the bore 5a of the conveying tube 5, the electronic components P in the storage chamber 2c can efficiently be introduced into the bore 5a of the conveying tube 5.

Furthermore, according to the aforesaid apparatus, since the cross section of the bore 5a of the conveying tube 5 is similar to the longitudinal end face shape of the electronic component P and slightly larger than the longitudinal end face shape, the apparatus can properly and stably convey electronic components P having the square pole shape in the alignment state without any problem such as an improper position.

Figure 14:
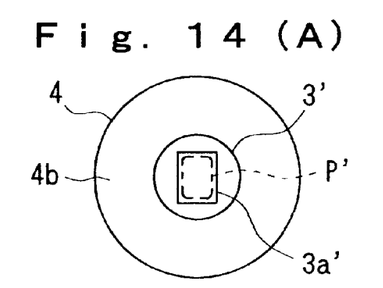
FIG. 14(A) is a view showing a modification of a bore of the stationary pipe.
FIG. 14(B) is a view showing a modification of a bore of the conveying tube.

By the way, the aforesaid apparatus can convey cylindrical electronic components P in the same way as electronic components having the square pole shape. When the apparatus is used to convey electronic components P' which meet a dimensional relationship such as length>width>height, the bore 3a' of a stationary pipe 3' should be provided with a rectangular cross section which is similar to the longitudinal end face shape of the electronic component P' and slightly larger than the longitudinal end face shape as shown in FIG. 14(A). In addition, a bore 5a' of a conveying tube 5' should be provided with a rectangular cross section which is almost the same as the cross section of the bore 3a' of the stationary pipe 3' as shown in FIG. 14(B).

Further, the aforesaid apparatus moves the slider 7 forward when the pressed rod 10a1 of the driving lever 10 is pushed down, and exerts the air suction through the suction passage into the bore 5a of the conveying tube 5 when the pressed rod 10a1 returns to its original position. However, an arrangement also achieves the same effects and advantages as described above which exerts the air suction through the suction passage into the bore 5a of the conveying tube 5 when the pressed rod 10a1 of the driving lever 10 is pushed down, and moves the slider 7 forward when the pressed rod 10a1 returns to its original position.

The preferred embodiments described herein are illustrative, not restrictive. The scope of the present invention is defined by the accompanying claims. The present invention covers all variations within the scope of the claims.

What is claimed is:

1. An electronic component feeding apparatus, comprising:
    a conveying passage for conveying electronic components having a predetermined shape in an alignment state;
    a sucking device for exerting an air suction into the conveying passage from an end of the conveying passage and conveying the electronic components in the conveying passage;
    a movable component stopper for stopping the electronic components conveyed in the alignment state by the air suction; and
    a displacing device for displacing the component stopper from a stop position to a removed position therefrom after the electronic components conveyed are stopped by the component stopper.

2. The electronic component feeding apparatus according to claim 1, wherein
    the sucking device is installed on an apparatus frame, the apparatus frame is provided with a lever mechanism for operating the sucking device.

3. The electronic component feeding apparatus according to claim 2, wherein
    the sucking device includes an air cylinder installed on the apparatus frame and a suction passage for connecting a suction port of the air cylinder and the end of the conveying passage.

4. The electronic component feeding apparatus according to claim 1, further comprising:
    a storage container for storing electronic components having the predetermined shape in a bulk state; and
    a take-in device for taking electronic components one by one into a start of the conveying passage.

5. The electronic component feeding apparatus according to claim 4, wherein
    the take-in device includes a movable member for stirring the electronic components in the storage container and leading the electronic components to the start of the conveying passage, and
    a lever mechanism for operating the the take-in device is installed on an apparatus frame.

6. The electronic component feeding apparatus according to claim 1, wherein
    the displacing device includes a movable member for displacing the component stopper from the stop position to the removed position, and
    a lever mechanism for operating the displacing device is installed on an apparatus frame.

7. The electronic component feeding apparatus according to claim 6, wherein
    the component stopper includes an adsorbent for attracting a forefront electronic component of the electronic components stopped by the component stopper.

8. The electronic component feeding apparatus according to claim 7, wherein
    the adsorbent is a permanent magnet, the forefront electronic component is attracted to the component stopper by magnetic force of the permanent magnet.

9. The electronic component feeding apparatus according to claim 1, wherein
    the conveying passage is composed of a tube having a bore whose cross section allows the electronic components to pass through the bore in a predetermined direction.

10. The electronic component feeding apparatus according to claim 9, wherein
    the cross section of the bore of the tube is similar to a longitudinal end face shape of an electronic component and slightly larger than the longitudinal end face shape.

11. The electronic component feeding apparatus according to claim 9, wherein
    the tube is made of a resin.

12. The electronic component feeding apparatus according to claim 9, wherein
    the tube is made of a metal.

13. An electronic component feeding apparatus, comprising:
    a conveying passage for conveying electronic components having a predetermined shape in a alignment state;
    a sucking device for exerting an air suction into the conveying passage from an end of the conveying passage and conveying the electronic components in the conveying passage; and
    a movable component stopper for stopping the electronic components conveyed in the alignment state by the air suction;
    wherein the conveying passage is composed of a tube having a bore whose cross section allows the electronic components to pass through the bore in a predetermined direction.

14. The electronic component feeding apparatus according to claim 13, wherein the cross section of the bore of the tube is similar to a longitudinal end face shape of a electronic component and slightly larger than the longitudinal end face shape.

15. The electronic component feeding apparatus according to claim 13, wherein the tube is made of a resin.

16. The electronic component feeding apparatus according to claim 13, wherein the tube is made of a metal.

17. The electronic component feeding apparatus according to claim 13, wherein the sucking device is installed on an apparatus frame, the apparatus frame is provided with a lever mechanism for operating the sucking device.

18. The electronic component feeding apparatus according to claim 17, wherein the sucking device includes an air cylinder installed on the apparatus frame and a suction passage for connecting a suction port of the air cylinder and the end of the conveying passage.

19. The electronic component feeding apparatus according to claim 13, further comprising:

a storage container for storing electronic components having the predetermined shape in a bulk state; and a take-in device for taking electronic components one by one into a start of the conveying passage.

20. The electronic component feeding apparatus according to claim 19, wherein the take-in device includes a movable member for stirring the electronic components in the storage container and leading the electronic components to the start of the conveying passage, and a lever mechanism for operating the the take-in device is installed on an apparatus frame.

21. A method of feeding electronic components having a predetermined shape comprising:

conveying the electronic components in an aligned state in a conveying passage by sucking air from an end of the conveying passage;

stopping the electronic components conveyed in the alignment state by the air suction with a component stopper; and displacing the component stopper from a stop position to a removed position after the conveyed electronic components were stopped by the component stopper.

* * * * *